United States Patent
Wang et al.

(10) Patent No.: US 11,106,138 B2
(45) Date of Patent: Aug. 31, 2021

(54) LITHOGRAPHY PROCESS AND MATERIAL FOR NEGATIVE TONE DEVELOPMENT

(71) Applicant: Taiwan Semiconductor Manufacturing Co., Ltd., Hsin-Chu (TW)

(72) Inventors: Chien-Wei Wang, Hsinchu County (TW); Wei-Han Lai, New Taipei (TW); Ching-Yu Chang, Yilang County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 140 days.

(21) Appl. No.: 16/102,908

(22) Filed: Aug. 14, 2018

(65) Prior Publication Data

US 2020/0057377 A1 Feb. 20, 2020

(51) Int. Cl.
*G03F 7/32* (2006.01)
*H01L 21/027* (2006.01)
*H01L 21/02* (2006.01)
*G03F 7/11* (2006.01)

(52) U.S. Cl.
CPC ............... *G03F 7/325* (2013.01); *G03F 7/11* (2013.01); *H01L 21/0276* (2013.01); *H01L 21/02282* (2013.01)

(58) Field of Classification Search
CPC .................................... G03F 7/32; G03F 7/40
See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 9,857,684 B2 | 1/2018 | Lin et al. |
| 9,859,206 B2 | 1/2018 | Yu et al. |
| 9,875,892 B2 | 1/2018 | Chang et al. |
| 2013/0045601 A1* | 2/2013 | Ogihara .................. G03F 7/094 438/694 |
| 2019/0055428 A1* | 2/2019 | Ashibe ............... C08G 73/1039 |

FOREIGN PATENT DOCUMENTS

| | | |
|---|---|---|
| CN | 101373340 | 2/2009 |
| CN | 107849362 | 3/2018 |
| JP | 2001222118 | 8/2001 |
| TW | 201033749 A | 9/2010 |
| TW | 201403665 | 1/2014 |
| TW | 201809877 A | 3/2018 |

\* cited by examiner

*Primary Examiner* — Kathleen Duda
(74) *Attorney, Agent, or Firm* — Haynes and Boone, LLP (57) ABSTRACT

The present disclosure provides resist rinse solutions and corresponding lithography techniques that achieve high pattern structural integrity for advanced technology nodes. An example lithography method includes forming a resist layer over a workpiece, exposing the resist layer to radiation, developing the exposed resist layer using a developer that removes an unexposed portion of the exposed resist layer, thereby forming a patterned resist layer, and rinsing the patterned resist layer using a rinse solution. The developer is an organic solution, and the rinse solution includes water.

20 Claims, 5 Drawing Sheets

LITHOGRAPHY PROCESS AND MATERIAL FOR NEGATIVE TONE DEVELOPMENT

BACKGROUND

Lithography is extensively utilized in integrated circuit (IC) manufacturing, where various IC patterns are transferred to a workpiece to form an IC device. A lithography process typically involves forming a resist layer over the workpiece, exposing the resist layer to patterned radiation, and developing the exposed resist layer, thereby forming a patterned resist layer. As IC technologies continually progress towards smaller technology nodes, the structural integrity of resist patterns becomes more vulnerable, as resist patterns are more prone to deformation, collapse, and/or peeling. Multiple factors affect these parameters, among which are the choice of developers and rinse solutions used on an exposed resist layer. Positive tone development (PTD) which removes exposed portions of the resist layer and negative tone development (NTD) which removes unexposed portions of the resist layer often use different developers and rinse solutions. Current PTD and NTD processes lead to various resist structural issues. Accordingly, although existing lithography techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to methods for manufacturing integrated circuit (IC) devices, and more particularly, to lithography techniques and/or lithography materials implemented during manufacturing of IC devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, such as "beneath," "below," "lower," "above," "upper," etc., may be used herein for ease of description to describe one element or feature's relationship to another element(s) or feature(s) as illustrated in figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the example term "below" can encompass both an orientation of above and below. An apparatus may be otherwise oriented (rotated 90 degrees or at other orientations) and the spatially relative descriptors may likewise be interpreted accordingly.

Lithography generally uses one of two types of developing processes: a positive tone development (PTD) process and a negative tone development (NTD) process. The PTD process uses a positive tone developer, which generally refers to a developer that selectively dissolves and removes exposed portions of the resist layer. The NTD process uses a negative tone developer, which generally refers to a developer that selectively dissolves and removes unexposed portions of the resist layer. The PTD process uses water-based developers and water-based rinse solutions. The NTD process uses organic-based developers and organic-based rinse solutions. Both PTD processes and NTD processes have drawbacks when attempting to meet lithography resolution demands for advanced technology nodes. For example, both PTD processes and NTD processes (particularly those using NTD developers that include n-butyl acetate solvents) have been observed to cause resist pattern swelling, leading to insufficient contrast between exposed portions and unexposed portions of the resist layer (in other words, poor resist contrast) and resulting in deformation, collapse, and/or peeling problems. In NTD, organic-based developers and organic-based rinse solutions are both prone to soften the resist (by causing the resist to swell), thereby damaging structural integrity of resist patterns. However, NTD typically provides better normalized image log-slope (NILS) than PTD. For this reason, NTD has become the focus for improving resolution for advanced technology nodes.

The present disclosure thus explores NTD-related materials and techniques that can improve the structural integrity of resist patterns. For example, the present disclosure solves issues in existing NTD approaches by changing the composition of rinse solutions. In some embodiments, instead of using purely organic solvents in a rinse solution, water is added to the rinse solution to significantly increase its chemical polarity, which in turn reduces its softening of resist patterns. Hydrogen bonds may be formed between water molecules and polymer molecules to "harden" the resist patterns. In some embodiments, the rinse solution includes other components such as a dipole solvent which helps the rinse solution to mix with the organic-based developer, a low surface tension solvent which helps the rinse solution to provide good "coverage" over the entire surface of patterned resist layer, and a crosslinking agent which helps linking together polymer chains within the resist pattern. The composition of the rinse solution is carefully configured herein to achieve effective rinsing while enhancing the structural integrity of patterned resist layer.

Figure 1:
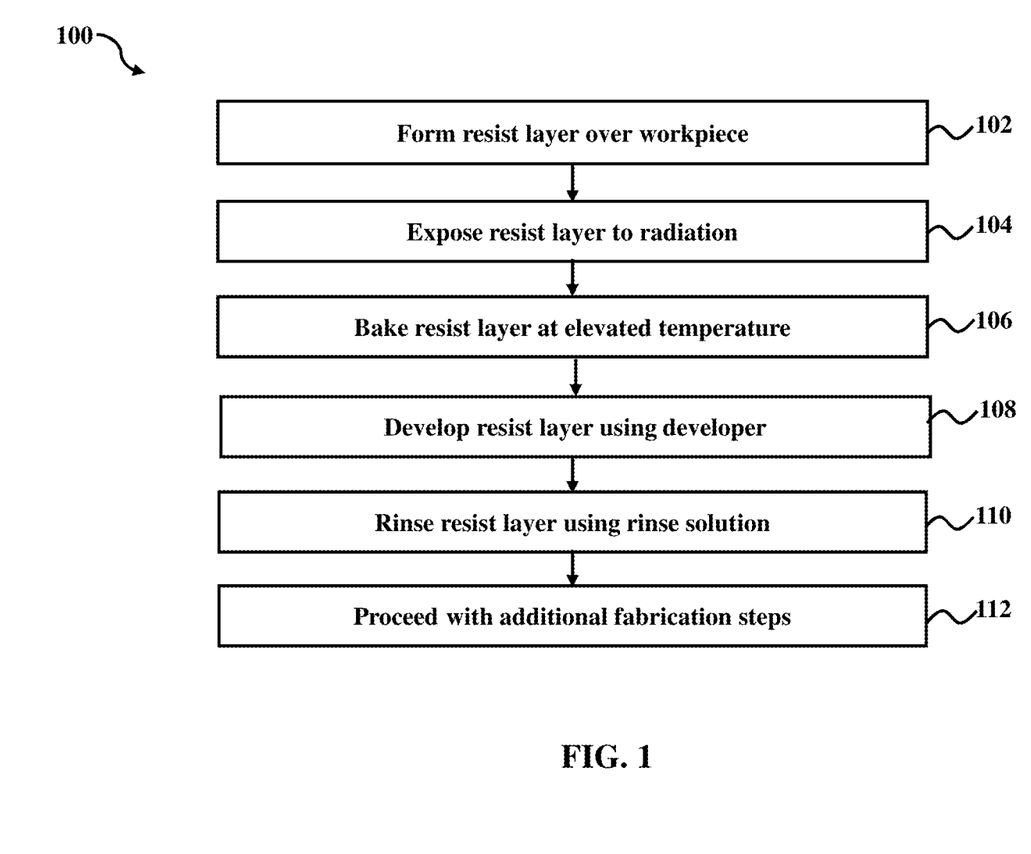
FIG. 1 is a flow chart of a lithography method for processing a workpiece according to various aspects of the present disclosure.

FIG. 1 is a flow chart of a lithography method 100 for processing a workpiece (e.g., a substrate) according to various aspects of the present disclosure. In some implementations, method 100 is implemented, in whole or in part, by a system employing advanced lithography processes, such as deep ultraviolet (DUV) lithography, extreme ultraviolet (EUV) lithography, e-beam lithography, x-ray lithography, and/or other lithography to enhance lithography resolution.

The steps of FIG. 1 are first introduced briefly and then elaborated in connection with FIGS. 2A-2F. At block 102, a resist layer is formed over a material layer of a workpiece. In some implementations, the resist layer is a negative tone resist, and the material layer is a portion of a wafer (or substrate). At block 104, the resist layer is exposed to radiation in the form of electromagnetic waves. In some implementations, the resist layer is exposed to patterned EUV radiation. At block 106, the exposed resist layer is baked at an elevated temperature using a post-exposure baking (PEB) process. At block 108, the baked resist layer is developed using a developer, which is an organic solvent. The developer dissolves or otherwise removes unexposed portions of the resist layer. At block 110, the developed resist layer is rinsed using a rinse solution.

Note that additional steps can be provided before, during, and after method 100, and some of the steps described can be moved, replaced, or eliminated for additional embodiments of method 100. For example, at block 112, method 100 can proceed with additional fabrication steps on the workpiece. In an embodiment, block 112 includes a fabrication process using the patterned resist layer as a mask to pattern the material layer on the workpiece. Specifically, the material layer is etched, such that the material layer includes a pattern corresponding with a pattern of the patterned resist layer. In some implementations, doped regions are formed in the material layer, such that the material layer includes doped regions a pattern corresponding with a pattern of the patterned resist layer.

FIGS. 2A-2F are fragmentary cross-sectional views of a workpiece 200, in portion or entirety, at various fabrication stages (such as those associated with method 100) according to various aspects of the present disclosure. Workpiece 200 is depicted at an intermediate stage of fabrication (or processing) of an IC device, such as a microprocessor, a memory, and/or other IC device. In some implementations, workpiece 200 may be a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin-like field effect transistors (FinFETs), other suitable IC components, or combinations thereof. FIGS. 2A-2F have been simplified for the sake of clarity. Additional features can be added in workpiece 200, and some of the features described below can be replaced, modified, or eliminated in other embodiments of workpiece 200.

Figure 2A:
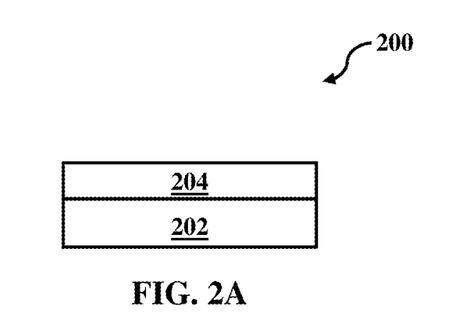
FIGS. 2A, 2B, 2C, 2D, 2E, and 2F are fragmentary cross-sectional views of a workpiece at various fabrication stages according to various aspects of the present disclosure.

In FIG. 2A, workpiece 200 includes a substrate 202. Substrate 202 may include a semiconductor substrate (e.g., a wafer), a mask (also called a photomask or reticle), or any base material on which processing may be conducted to provide layers of material to form various features of an IC device. Depending on an IC fabrication stage, substrate 202 includes various material layers (e.g., dielectric layers, semiconductor layers, and/or conductive layers) configured to form IC features (e.g., doped regions/features, isolation features, gate features, source/drain features (including epitaxial source/drain features), interconnect features, other features, or combinations thereof). In the depicted embodiment, substrate 202 includes a semiconductor substrate, such as a silicon substrate. Substrate 202 may include another elementary semiconductor, such as germanium; a compound semiconductor, such as silicon carbide, gallium arsenide, gallium phosphide, indium phosphide, indium arsenide, and/or indium antimonide; an alloy semiconductor, such as SiGe, GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, where workpiece 200 is fabricated into a mask for patterning IC devices, substrate 202 can be a mask substrate that includes a transparent material (e.g., calcium fluoride ($CaF_2$)) or a low thermal expansion material (e.g., fused quartz, $TiO_2$ doped $SiO_2$, or other suitable low thermal expansion materials).

A material layer 204 to be processed (also referred to herein as an underlying layer) is disposed over substrate 202. However, the present disclosure contemplates implementations where material layer 204 is omitted, such that substrate 202 is directly processed. In some implementations, material layer 204 includes a conductive material or a semiconductor material, such as metal or metal alloy. In some implementations, the metal includes titanium (Ti), aluminum (Al), tungsten (W), tantalum (Ta), copper (Cu), cobalt (Co), ruthenium (Ru), other suitable metal, or combinations thereof. In some implementations, the metal alloy includes metal nitride, metal sulfide, metal selenide, metal oxide, metal silicide, other suitable metal alloy, or combinations thereof. For example, in some implementations, material layer 204 includes titanium nitride (TiN), tungsten nitride ($WN_2$), or tantalum nitride (TaN).

Alternatively, material layer 204 includes a dielectric material, such as silicon oxide ($SiO_2$), silicon nitride (SiN), metal oxide, or metal nitride. For example, material layer 204 may include $SiO_2$, SiN, silicon oxynitride (SiON), silicon carbon nitride (SiCN), silicon carbide (SiC), aluminum oxide ($Al_2O_3$), hafnium oxide ($HfO_2$), or lanthanum oxide ($La_2O_3$). In some implementations, material layer 204 is a hard mask layer to be patterned for use in subsequent processing of workpiece 200. In some implementations, material layer 204 is an anti-reflective coating (ARC) layer. In some implementations, material layer 204 is a layer to be used for forming a gate feature (e.g., a gate dielectric and/or a gate electrode), a source/drain feature (e.g., an epitaxial source/drain), and/or a contact feature (e.g., a conductive or dielectric feature of a multilayer interconnect (MLI)) of workpiece 200. In some implementations, where workpiece 200 is fabricated into a mask for patterning IC devices, material layer 204 is a layer to be processed to form an IC pattern therein, such as an absorber layer (including, for example, chromium) or a reflective layer (including, for example, multiple layers formed on substrate 202, where the multiple layers include a plurality of film pairs, such as molybdenum-silicide (Mo/Si) film pairs, molybdenum-beryllium (Mo/Be) film pairs, or other suitable material film pairs configured for reflecting radiation).

Figure 2B:
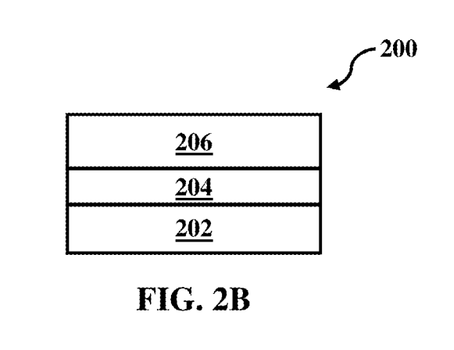

In FIG. 2B, a resist layer 206 is formed over substrate 202 by a suitable process (e.g., block 102 of method 100). Resist layer 206 is also called a photoresist layer, photosensitive layer, imaging layer, patterning layer, or radiation sensitive layer. Resist layer 206 is sensitive to radiation used during a lithography exposure process, such as DUV radiation, EUV radiation, e-beam radiation, ion beam radiation, and/or other suitable radiation. In the depicted embodiment, resist layer 206 includes a material sensitive to EUV radiation. In some implementations, resist layer 206 is formed by spin coating a liquid resist material onto a material layer to be processed, such as material layer 204. After spin coating the liquid resist material (but before performing an exposure process), a pre-bake process can be performed on resist layer 206, for example, to evaporate solvent and to densify the liquid resist material formed over material layer 204.

In some embodiments, resist layer 206 includes a negative tone material (sometimes called a negative tone resist), where portions of resist layer 206 exposed to radiation become insoluble (or exhibit reduced solubility) to a developer, and unexposed portions of resist layer 206 remain soluble to the developer. Resist layer 206 may include a chemically amplified resist (CAR) material. In some implementations, the CAR material includes a polymer and/or other suitable resist components mixed in a solvent, which are configured to provide the negative tone material. The other resist components can include a photo acid generator (PAG) component, a thermal acid generator (TAG) component, an acid labile group (ALG) component, a quencher component, a photo-decomposable base (PDB) component, a chromophore component, a cross-linker component, a surfactant component, and/or other suitable component depending on requirements of the CAR material. In some implementations, the CAR resist material includes the PAG component, which generates acid upon absorbing radiation. In the depicted embodiment, where resist layer 206 is a negative tone resist layer, acid generated from the PAG component catalyzes cross-linking of polymer in the CAR resist material and/or suppressing reactions of other resist components with polymer in the CAR resist material, changing characteristics (e.g., polarity and/or solubility) of exposed portions of resist layer 206. For example, when resist layer 206 is exposed with radiation reaching a defined exposure dose threshold, exposed portions of resist layer 206 exhibit decreased solubility in (and/or increased hydrophobicity to) a developer.

Figure 2C:
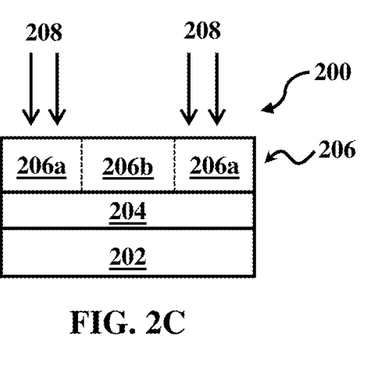

In FIG. 2C, an exposure process is performed on resist layer 206 (e.g., block 104 of method 100), where resist layer 206 is illuminated with patterned radiation 208. In some implementations, patterned radiation 208 has a wavelength less than about 250 nm, such as DUV radiation (e.g., 248 nm radiation from a KrF laser or 193 nm radiation from an ArF laser), EUV radiation, x-ray radiation, e-beam radiation, ion-beam radiation, and/or other suitable radiation. In the depicted embodiment, patterned radiation 208 is EUV radiation, which may refer to radiation having a wavelength of about 1 nm to about 100 nm. In some implementations, the EUV radiation has a wavelength of about 10 nm to about 15 nm (e.g., about 13.5 nm). The exposure process can be in air, liquid (immersion lithography), or vacuum (e.g., when implementing EUV lithography and/or e-beam lithography). In some implementations, the radiation is patterned using a mask having an IC pattern defined therein, such that the patterned radiation forms an image of the IC pattern on resist layer 206. The mask transmits, absorbs, and/or reflects the radiation depending on the IC pattern, along with mask technologies used to fabricate the mask. In some implementations, the radiation beam is patterned by directly modulating the radiation beam according to an IC pattern without using a mask (sometimes called maskless lithography).

A latent pattern is formed on resist layer 206 by the exposure process. The latent pattern is formed on the resist layer, which eventually becomes a physical resist pattern when the resist layer is subjected to developing and rinsing processes. The latent pattern includes exposed portions 206a and unexposed portions 206b (which may include both unexposed portions and under-exposed portions of resist layer 206). As shown in FIG. 2C, exposed portions 206a physically and/or chemically change in response to the exposure process. For example, PAG components in exposed portions 206a of resist layer 206 generate acid upon absorbing radiation, which functions as a catalyst for causing chemical reactions that decrease (or increase) solubility of exposed portions 206a. For example, acid generated from the PAG components catalyzes cross-linking of polymer and/or suppressing reactions of other resist components (such as ALG components) with polymer in exposed portions 206a of resist layer 206, thereby chemically changing exposed portions 206a.

After the exposure process, a post-exposure baking (PEB) process (e.g., block 106 of method 100) may be performed on resist layer 206. PEB can promote the cross-linking of polymer and/or suppression of reactions of other resist components with the polymer. Depending on the polymer(s) included in resist layer 206, PEB may catalyze a reaction between reacted photosensitive moieties and the polymer in resist layer 206. Any suitable baking conditions (e.g., duration or temperature profiles, baking cycles) may be used. In the depicted embodiment, the exposure process and/or the PEB process increase the polarity of exposed portions 206a, decreasing solubility of exposed portions 206a to a developer with relatively low polarity. In contrast, the polarity of unexposed portions 206b remains low (or increases less than exposed portions 206a) after the PEB process, so unexposed portions 206b are more soluble in a developer with relatively low polarity.

Figure 2D:
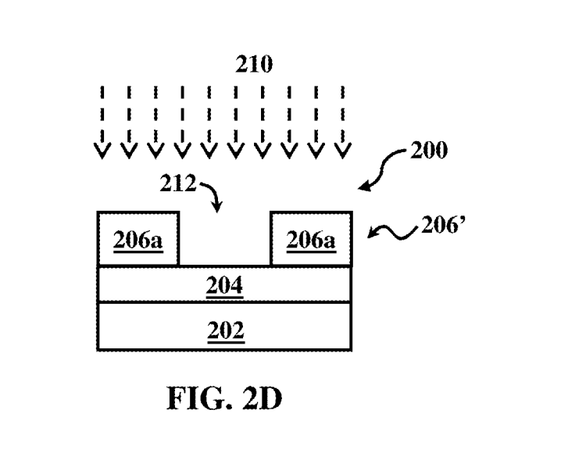

In FIG. 2D, a developing process is performed on resist layer 206 (e.g., block 108 of method 100), thereby forming a patterned resist layer 206'. In the depicted embodiment, an NTD process is performed to remove unexposed portions 206b of patterned resist layer 206'. For example, an NTD developer 210 is applied to resist layer 206 that dissolves unexposed portions 206b, leaving patterned resist layer 206' having opening(s) 212 defined therein between exposed portions 206a (collectively called a resist pattern). Since NTD developer 210 is organic solvent-based, suitable organic solvents include n-butyl acetate, ethanol, hexane, benzene, toluene, and/or other suitable solvents. In some implementations, NTD developer 210 contains no water (it is understood that de minimis amount of water content may be present, for example, due to humidity in surrounding environment or other incidental reasons). Applying NTD developer 210 may include spraying NTD developer 210 on patterned resist layer 206' by a spin-coating process.

Figure 2E:
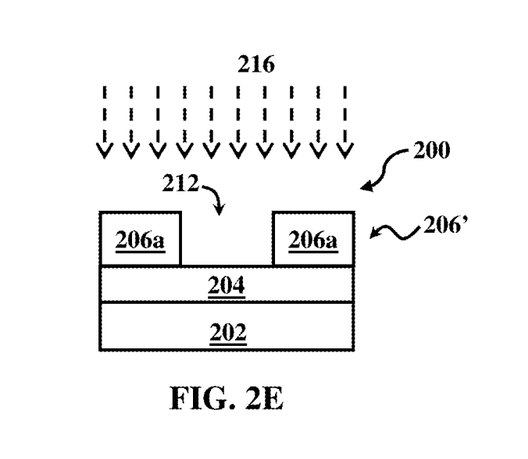

In FIG. 2E, a rinse process is performed after the developing process, for example, to remove any residue and/or particles from workpiece 200 (e.g., block 110 of method 100). In the depicted embodiment, a rinse solution 216 is applied to patterned resist layer 206' to remove unwanted materials. Existing developers and rinse solutions both use organic solvents. Although the organic solvents are generally adequate for their intended purposes, they often lead to various issues, especially when technology nodes become smaller (e.g., 20 nm, 10 nm, 7 nm, and beyond). For instance, during the development process, the organic solvent is prone to penetrate into the photoresist and soften the photoresist (e.g., by causing the photoresist to swell in volume), thereby damaging structural integrity of photoresist patterns. The issues become more serious with smaller patterns because the softening is more likely to induce pattern deformation, collapse, and/or peeling. Existing rinse solutions exacerbate such issues because they are also organic solvents. In chemistry, the "like dissolves like" theory provides that polar solutions dissolve polar substances and non-polar solutions dissolve non-polar substances. Therefore, organic solvents used in developing and rinsing are prone to soften the photoresist because the organic solvents and the photoresist share similar polarities.

The present disclosure solves issues in existing approaches by changing the composition of rinse solutions. Water, such as de-ionized water (DIW), is added to rinse solution 216 to increase the overall polarity of rinse solution 216, which in turn reduces softening of patterned resist layer 206'. In some embodiments, the polarity of rinse solution 216 is higher than the polarity of NTD developer 210, or the polarity of patterned resist layer 206' (including both exposed portions 206a and unexposed portions 206b), or both. That is, rinse solution 216 has a relatively high polarity. Accordingly, the polarity of rinse solution 216 may be designed according to the polarity of NTD developer 210 and/or resist layer 206. In some embodiments, the term "polarity" describes a dipole moment. Therefore, the overall dipole moments of polarity molecules of rinse solution 216 may be higher than either one or both of the overall dipole moment of polarity molecules of NTD developer 210 and resist layer 206. As rinse solution 216 includes various components, the overall polarity of rinse solution 216 may be computed using any suitable manner (e.g., a weighted combination of components).

Figure 3:
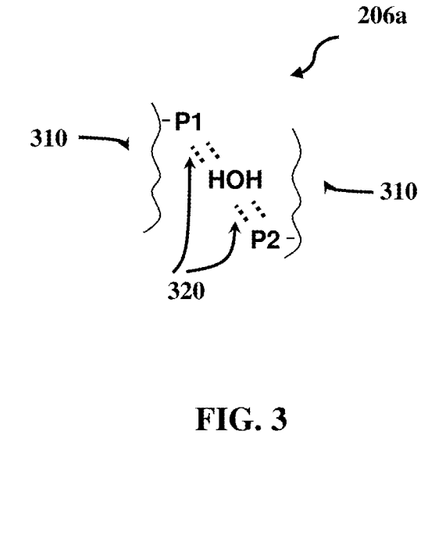
FIG. 3 is a simplified schematic diagram showing certain molecules in an exposed portion of a patterned resist layer according to various aspects of the present disclosure.

The water content in rinse solution 216 also improves structural stability of patterned resist layer 206' via hydrogen bonds. FIG. 3 is a simplified schematic diagram of certain molecules in an exposed portion 206a after the rinsing process. Exposed portion 206a contains polymer molecules 310, which have polar functional groups (represented by P1 and P2) that interact with water molecules (represented by HOH). As shown in FIG. 3, when a water molecule penetrates into exposed portion 206a, one or more hydrogen bonds 320 may be formed between the water molecule and polar functional group P1, or P2, or both. Water molecules and hydrogen bonds 320 link multiple polymer molecules 310 together to form longer polymer chains, which in a sense "hardens" exposed portion 206a. Water molecules may additionally interact with polymer molecules 310 via dipole-dipole interactions. Water does not otherwise dissolve polymer molecules 310. Therefore, water in rinse solution 216 enhances structural stability of patterned resist layer 206' by reducing pattern deformation, collapse, and/or peeling. The polar functional groups P1 and P2 may include —OH, —COO, COOH, —NH, —S, —SO, lactone, or other suitable polar functional groups, or combinations thereof.

Note that, although the present disclosure uses water as an example hardening chemical because of its ability to form strong hydrogen bonds with polymer molecules, other suitable chemicals may also be used if they realize similar effect.

The composition of rinse solution 216 is carefully configured herein to achieve optimal result. For instance, the amount of water added to rinse solution 216 is designed to be within a specific range because, even though water helps reduce or avoid softening of patterned resist layer 206', too much water in rinse solution 216 may negatively impact the ability of rinse solution 216 to rinse patterned resist layer 206'. The reason is that, even though most of NTD developer 210 is spun off of the surface of patterned resist layer 206' during the development process, a layer of NTD developer 210 may still remain on the surface of patterned resist layer 206' after the development process. If rinse solution 216 contains too much water, rinse solution 216 may not mix well with NTD developer 210 due to significant difference in polarities. If rinse solution 216 does not penetrate the layer of NTD developer 210, rinse solution 216 cannot reach the surface of patterned resist layer 206' for effective rinsing. Further, water has high surface tension and may not effectively reach certain surface areas of patterned resist layer 206'(e.g., near bottom corners with odd angles). Therefore, water constitutes between about 1% and about 30% of rinse solution 216 (e.g., about 15% in an example, or between about 5% and about 20% in another example). Unless otherwise noted, percentages herein designate percentages by weight. Note that, in some embodiments, the amount of water is at least about 5% to ensure sufficient increase in the overall polarity of rinse solution 216. Further, since the rinsing process involves spinning workpiece 200, the amount of water may increase (e.g., from about 5% to a higher percentage) during and after the rinsing process, as other solvent(s) that have lower boiling points than water get spun off from workpiece 200.

Rinse solution 216 may include water and one or more organic solvents. In some embodiments, rinse solution 216 includes a dipolar solvent such as diol, diacid, and/or diamine. Molecules of the dipolar solvent may also interact with polymer molecules 310, for example, through dipole-dipole interactions or hydrogen bonds. The dipole solvent may not interact with polymer molecules 310 as strongly as water does, but the dipole solvent has good mixing ability with NTD developer 210. Therefore, a suitable amount of dipolar solvent helps reach optimal rinsing result. In some embodiments, the dipolar solvent constitutes between about 5% to about 70% of rinse solution 216, where the lower limit ensures mixing ability with NTD developer 210, while the upper limit is determined by the amount of water in rinse solution 216 (e.g., if rinse solution 216 has about 30% of water it cannot have more than about 70% of dipolar solvent). In an embodiment, diamine is used as the dipolar solvent because it mixes well in both water and the organic-based NTD developer 210 and because it forms strong hydrogen bonds with exposed portion 206a.

In some embodiments, rinse solution 216 includes a low surface tension solvent that has a surface tension lower than a predetermined threshold (e.g., about 35 dyn/cm against air). Since water has high surface tension (about 72-73 dyn/cm against air), if rinse solution 216 contains only water it may not have sufficient wettability to reach certain surface areas of patterned resist layer 206' (e.g., near bottom corners with odd angles). The low surface tension solvent lowers the overall surface tension of rinse solution 216, and in turn, helps rinse solution 216 provide good "coverage" over the entire surface of patterned resist layer 206'. In some embodiment, the low surface tension solvent includes diethylene glycol (with a surface tension of about 30 dyn/cm), or diamine (some with a surface tension of about 31 dyn/cm), or other suitable solvents, or combinations thereof. In some embodiment, the dipolar solvent and the low surface tension solvent are the same solvent (e.g., diamine). The low surface tension solvent may or may not form hydrogen bonds.

In some embodiments, the low surface tension solvent constitutes between about 10% to about 70% of rinse solution 216, where the lower limit ensures wettability, while the upper limit is determined by the amount of water in rinse solution 216 (e.g., if rinse solution 216 has about 30% of water it cannot have more than about 70% of low surface tension solvent). In some embodiments, although the low surface tension solvent itself may have a surface tension as low as about 25%, its volume is limited such that the overall surface tension of rinse solution 216 (after components are mixed) is about 35 dyn/cm or higher. Maintaining the overall surface tension of rinse solution 216 helps reduce or avoid the softening problems described above. In some embodiments, the overall surface tension of rinse solution 216 is higher than the surface tension of NTD developer 210, which is below about 35 dyn/cm.

In some embodiments, rinse solution 216 includes a crosslinking agent, which is a solute that can crosslink with polymer molecules 310 of patterned resist layer 206'. The crosslinking agent is an organic material, such as diamine or carbodiimide, that may form covalent bonds with functional groups of polymer molecules 310. For example, the crosslinking agent may have two polar functional groups that covalently bond with two COOH groups of two polymer molecules 310. The crosslinking helps harden patterned resist layer 206'. In some embodiments, the crosslinking agent constitutes between about 0.01% to about 15% of rinse solution 216, where the lower limit ensures sufficient crosslinking of patterned resist layer 206', while the upper limit is determined by the solubility of the crosslinking agent within rinse solution 216 (e.g., if rinse solution 216 has about 30% of water and if water cannot dissolve more than about 50% of crosslinking agent, the crosslinking agent is limited to about 15%).

As described above, various components (including both solvent and solute) in rinse solution 216—such as water, dipolar solvent, low surface tension solvent, and/or crosslinking agent—are carefully configured herein to achieve optimal results (effective rinsing while maintaining the structural integrity of patterned resist layer 206'). Both the types and relative quantities of these components may be selected in a combinatory fashion. In some embodiments, rinse solution 216 includes about 20% of water, 10%-20% of dipolar solvent, 60-70% of low surface tension solvent, while the crosslinking agent makes up the rest. In an embodiment, rinse solution 216 includes about 20% of water, about 15% dipolar solvent, about 64% of low surface tension solvent, and about 1% of crosslinking agent. As further described below, rinsing conditions such as duration, temperature, and spin speed may also be tailored to achieve optimal results.

After the rinsing process, in some implementations a post-development baking (PDB) process is performed, for example, to further enhance structural stability of patterned resist layer 206'. The PDB process may be performed in a chamber (e.g., a hot plate) with an oven tool in semiconductor fabrication.

Figure 2F:
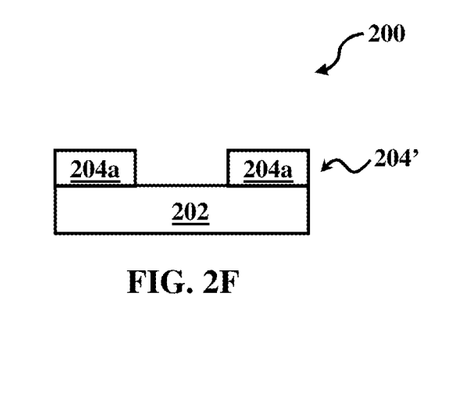

Referring now to FIG. 2F, an additional fabrication process is performed on workpiece 200 using patterned resist layer 206' as a mask (e.g., corresponding to block 112 of method 100). For example, the fabrication process is applied within opening(s) of patterned resist layer 206', while other portions of workpiece 200 covered by patterned resist layer 206' are protected from being impacted by the fabrication process. In some implementations, the fabrication process etches material layer 204 using patterned resist layer 206' as an etching mask. A pattern is thus transferred from patterned resist layer 206' to material layer 204, thereby forming patterned material layer 204' with patterns 204a. The etching process may include a dry etching process, a wet etching process, other suitable etching process, or combinations thereof. Alternatively, the fabrication process may include an implantation process on material layer 204 using patterned resist layer 206' as an implant mask, thereby forming various doped features (regions) in material layer 204. Thereafter, as depicted in FIG. 2E, patterned resist layer 206' is removed from workpiece 200, leaving patterned material layer 204' disposed over substrate 202. The present disclosure also contemplates implementations where, instead of patterning material layer 204, a deposition process is performed to fill opening(s) 212 of patterned resist layer 206' with a material, thereby forming IC features (e.g., conductive material lines) over material layer 204.

Figure 4:
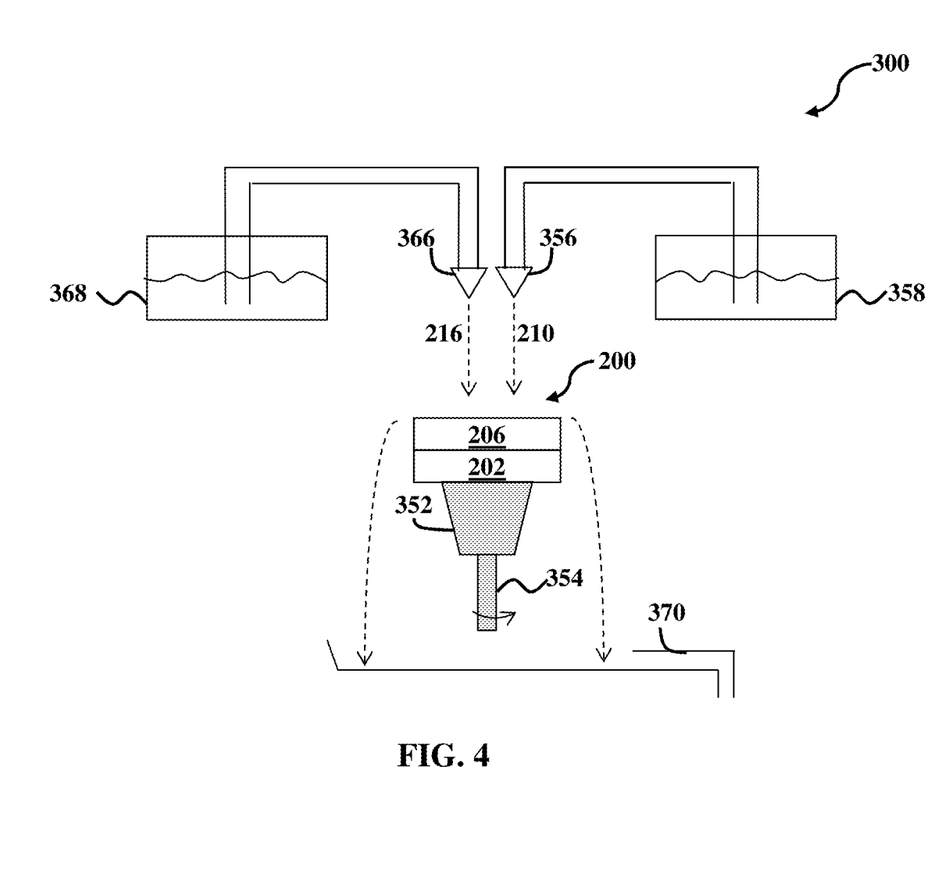
FIG. 4 is a simplified block diagram of a developing and rinsing system according to various aspects of the present disclosure.

In some implementations, NTD developer 210 and rinse solution 216 are applied to workpiece 200 in a developing and rinsing system. FIG. 4 is a simplified block diagram of a developing and rinsing system 300, which can be implemented for developing and rinsing resist layer 206 according to various aspects of the present disclosure. Developing and rinsing system 300 includes a wafer stage 352 having a workpiece (e.g., workpiece 200) secured thereon by a vacuum mechanism, e-chucking, or other suitable mechanism. A motion mechanism 354 integrated with wafer stage 352 drives wafer stage 352, such that wafer stage 352 spins workpiece 200 during a developing process. In some implementations, motion mechanism 354 includes a motor to drive wafer stage 352 to spin at various speeds depending on processing stage, such as a first speed during a developing process and a second speed during a rinsing process. In some implementations, motion mechanism 354 includes an elevation system configured to move wafer stage 352 along a vertical direction and/or horizontal direction, such that workpiece 200 can be positioned at different levels within developing and rinsing system 300. A nozzle 356 delivers a developer (e.g., NTD developer 210) to workpiece 200. In some implementations, nozzle 356 dispenses NTD developer 210 while workpiece 200 is spun by wafer stage 352. NTD developer 210 can be stored in a container 358 and then be delivered to nozzle 356 via a delivery system (e.g., a pump, a pressurized gas, or other mechanism configured to deliver the developer via one or more pipelines to nozzle 356). As described above, NTD developer 210 includes one or more organic solvents. In some embodiments, organic solvents are pre-mixed and stored in container 358. Alternatively, organic solvents are stored in separate containers and mixed through the delivery system as NTD developer 210 is applied to workpiece 200. After NTD developer 210 is spun off workpiece 200, drain outlet 370 guides NTD developer 210 out of developing and rinsing system 300, for example, towards a waste process system.

In some implementations, developing and rinsing system 300 applies NTD developer 210 in a spin-on process, for example, by spraying NTD developer 210 onto resist layer 206 while spinning workpiece 200. In some implementations, NTD developer 210 is continuously sprayed onto workpiece 200. Alternatively, in some implementations, NTD developer 210 is applied by other means, such as a puddle process. In some implementations, developing and rinsing system 300 is part of a cluster tool in an IC fabrication process. For example, after resist layer 206 has been exposed in a lithography system, workpiece 200 is transferred to developing and rinsing system 300.

Following the development process, another nozzle 366 delivers a rinse solution (e.g., rinse solution 216) to workpiece 200. In some implementations, nozzle 366 dispenses rinse solution 216 onto patterned resist layer 206' in ways similar to the dispensing of NTD developer 210. Rinse solution 216 can be stored in a container 368 and then be delivered to nozzle 366 via a delivery system (e.g., a pump, a pressurized gas, or other mechanism configured to deliver the developer via one or more pipelines to nozzle 366). As described above, rinse solution 216 includes water and one or more organic solvents. In some embodiments, components of rinse solution 216 are pre-mixed and stored in container 368. In some implementations, developing and rinsing system 300 controls a mixing ratio between various components of rinse solution 216.

After rinse solution 216 is spun off workpiece 200, drain outlet 370 guides rinse solution 216 out of developing and rinsing system 300, for example, towards a waste process system. Note that both NTD developer 210 (organic solution with no water) and rinse solution 216 (with water) may be guided out of system 300 by the same drain outlet 370. In other words, the organic solution and water-based solution may be delivered to the same waste process system. This is different from existing developing and rinsing systems where organic solutions and water-based solutions are delivered to and processed by separate waste process systems.

Note that developing and rinsing system 300 can include additional features depending on implemented lithography process technologies. FIG. 4 has been simplified for the sake of clarity. Additional features can be added in developing and rinsing system 300, and some of the features described below can be replaced or eliminated for additional embodiments of developing and rinsing system 300.

The present disclosure provides various resist rinse solutions and corresponding lithography techniques for improving structural integrity of patterned resist layers. An example lithography method includes forming a resist layer over a workpiece, exposing the resist layer to radiation, developing the exposed resist layer using a developer that removes an unexposed portion of the exposed resist layer, thereby forming a patterned resist layer, and rinsing the patterned resist layer using a rinse solution. The developer is an organic solution, and the rinse solution includes water. In an embodiment, during the rinsing the water penetrates into the patterned resist layer such that hydrogen bonds are formed between molecules of the water and polar functional groups of the patterned resist layer. In an embodiment, the water constitutes between about 5% and about 30% of the rinse solution. In an embodiment, the rinse solution further includes a dipolar solvent that constitutes between about 5% and about 70% of the rinse solution. In an embodiment, the rinse solution includes a solvent that has a surface tension lower than about 35 dyn/cm. In an embodiment, the solvent that has a surface tension lower than about 35 dyn/cm constitutes between about 10% and about 70% of the rinse solution. In an embodiment, the rinse solution has an overall surface tension greater than about 35 dyn/cm. In an embodiment, the rinse solution includes a crosslinking agent. In an embodiment, the crosslinking agent constitutes between about 0.01% and about 15% of the rinse solution. In an embodiment, the organic solution of the developer includes n-butyl acetate but includes no water, wherein the rinse solution includes between 5%-30% of water, between 10%-20% of a dipolar solvent, and between 0.01%-15% of a crosslinking agent.

In another example aspect, the present disclosure provides a method for IC manufacturing. The method comprises forming a resist layer over a workpiece, exposing the resist layer to patterned radiation, removing an unexposed portion of the resist layer in a negative tone developer, thereby forming a patterned resist layer, wherein the negative tone developer includes an organic solvent, and rinsing the patterned resist layer in a rinse solution, wherein the rinse solution has an overall surface tension that is higher than a surface tension of the organic solvent. In an embodiment, the overall surface tension of the rinse solution is at least about 35 dyn/cm against air, and wherein the surface tension of the organic solvent is less than about 35 dyn/cm against air. In an embodiment, the rinse solution has an overall polarity that is higher than both a polarity of the patterned resist layer and a polarity of the organic solvent. In an embodiment, the rinse solution includes between about 5% and about 30% of water and between about 5% and about 70% of a dipolar solvent. In an embodiment, the rinse solution further includes between 0.01%-15% of a crosslinking agent. In an embodiment, the rinse solution further includes a solvent that has a surface tension lower than about 35 dyn/cm. In an embodiment, the method further comprises after exposing the resist layer and before removing the unexposed portion of the resist layer, performing a baking process on the resist layer; and after rinsing the patterned resist layer in the rinse solution, processing the workpiece using the patterned resist layer as a mask.

In yet another example aspect, the present disclosure provides a rinse solution for rinsing a patterned resist layer after NTD. The rinse solution comprises water, a dipolar solvent, and a crosslinking agent. In an embodiment, the water constitutes between 5% and 30% of the rinse solution, the dipolar solvent constitutes between 5% and 70% of the rinse solution, and the crosslinking agent constitutes between 0.01% and 15% of the rinse solution. In an embodiment, the rinse solution further includes a solvent that has a surface tension lower than 35 dyn/cm.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography method comprising:
    forming a resist layer over a workpiece;
    exposing the resist layer to radiation;
    developing the exposed resist layer using a developer that removes an unexposed portion of the exposed resist layer, thereby forming a patterned resist layer;
    rinsing the patterned resist layer using a rinse solution, wherein a portion of the developer is disposed on a surface of the patterned resist layer during the rinsing of the patterned resist layer using the rinse solution; and
    wherein the developer is an organic solution, and wherein the rinse solution includes between about 5% and about 30% water such that the rinse solution penetrates through the portion of the developer and reaches the surface of the patterned resist layer to thereby harden the patterned resist layer during the rinsing of the patterned resist layer.

2. The lithography method of claim 1, wherein during the rinsing the water penetrates into the patterned resist layer such that hydrogen bonds are formed between molecules of the water and polar functional groups of the patterned resist layer.

3. The lithography method of claim 1, wherein the rinse solution further includes a dipolar solvent that constitutes between about 5% and about 70% of the rinse solution.

4. The lithography method of claim 1, wherein the rinse solution includes a solvent that has a surface tension lower than about 35 dyn/cm.

5. The lithography method of claim 4, wherein the solvent that has a surface tension lower than about 35 dyn/cm constitutes between about 10% and about 70% of the rinse solution.

6. The lithography method of claim 4, wherein the rinse solution has an overall surface tension greater than about 35 dyn/cm.

7. The lithography method of claim 1, wherein the rinse solution includes a crosslinking agent.

8. The lithography method of claim 7, wherein the crosslinking agent constitutes between about 0.01% and about 15% of the rinse solution.

9. The lithography method of claim 1, wherein the organic solution of the developer includes n-butyl acetate but includes no water, wherein the rinse solution includes between about 10% and about 20% of a dipolar solvent and between about 0.01% and about 15% of a crosslinking agent.

10. The method of claim 1, further comprising:
during the developing the exposed resist layer, spinning the workpiece at a first speed; and
during the rinsing the patterned resist layer, spinning the workpiece at a second speed that is different than the first speed.

11. A method for integrated circuit (IC) manufacturing, the method comprising:
forming a resist layer over a workpiece;
exposing the resist layer to patterned radiation;
removing an unexposed portion of the resist layer in a negative tone developer, thereby forming a patterned resist layer, wherein the negative tone developer includes an organic solvent; and
rinsing the patterned resist layer in a rinse solution, wherein a layer of the negative tone developer is disposed on a surface of the patterned resist layer during the rinsing of the patterned resist layer, wherein the rinse solution includes between about 5% and about 30% water such that the rinse solution penetrates through the layer of the negative tone developer and reaches the surface of the patterned resist layer to thereby harden the patterned resist layer during the rinsing of the patterned resist layer, wherein the overall surface tension of the rinse solution is higher than a surface tension of the organic solvent.

12. The method of claim 11, wherein the overall surface tension of the rinse solution is at least about 35 dyn/cm against air, and-wherein the surface tension of the organic solvent is less than about 35 dyn/cm against air.

13. The method of claim 11, wherein the rinse solution has an overall polarity that is higher than both a polarity of the patterned resist layer and a polarity of the organic solvent.

14. The method of claim 11, wherein the rinse solution further includes between about 5% and about 70% of a dipolar solvent.

15. The method of claim 14, wherein the rinse solution further includes between about 0.01% and about 15% of a crosslinking agent.

16. The method of claim 15, wherein the rinse solution further includes a solvent that has a surface tension lower than about 35 dyn/cm.

17. The method of claim 11, further comprising:
after exposing the resist layer and before removing the unexposed portion of the resist layer, performing a baking process on the resist layer; and
after rinsing the patterned resist layer in the rinse solution, processing the workpiece using the patterned resist layer as a mask.

18. A method comprising:
forming a resist layer over a substrate;
exposing a first portion of the resist layer to radiation while a second portion of the resist layer is covered thereby unexposed to the radiation;
applying a negative tone developer to the resist layer to remove the unexposed second portion of the resist layer to thereby form a patterned resist layer; and
rinsing the patterned resist layer with a rinse solution, wherein a portion of the negative tone developer remains disposed on a portion of the patterned resist layer during the rinsing of the patterned resist layer using the rinse solution, wherein the rinse solution includes between about 5% and about 30% water such that the rinse solution has a higher polarity than both a polarity of the patterned resist layer and a polarity of the negative tone developer.

19. The method of claim 18, wherein the rinse solution further includes a dipolar solvent and a crosslinking agent.

20. The method of claim 19,
wherein the dipolar solvent constitutes between about 5% and about 70% of the rinse solution, and
wherein the crosslinking agent constitutes between about 0.01% and about 15% of the rinse solution.

* * * * *